(12) United States Patent
Kuroyanagi

(10) Patent No.: US 10,560,068 B2
(45) Date of Patent: Feb. 11, 2020

(54) MULTIPLEXER

(71) Applicant: TAIYO YUDEN CO., LTD., Tokyo (JP)

(72) Inventor: Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 149 days.

(21) Appl. No.: 15/916,081

(22) Filed: Mar. 8, 2018

(65) Prior Publication Data

US 2018/0278238 A1    Sep. 27, 2018

(30) Foreign Application Priority Data

Mar. 21, 2017    (JP) .................................. 2017-054823

(51) Int. Cl.
| | |
|---|---|
| *H03H 9/05* | (2006.01) |
| *H03H 9/64* | (2006.01) |
| *H01L 41/053* | (2006.01) |
| *H03H 9/72* | (2006.01) |
| *H03H 9/70* | (2006.01) |

(52) U.S. Cl.
CPC ......... *H03H 9/0547* (2013.01); *H01L 41/053* (2013.01); *H03H 9/0571* (2013.01); *H03H 9/0576* (2013.01); *H03H 9/6406* (2013.01); *H03H 9/70* (2013.01); *H03H 9/706* (2013.01); *H03H 9/725* (2013.01)

(58) Field of Classification Search
CPC .. H03H 9/0547; H03H 9/0571; H03H 9/0576; H03H 9/14541; H03H 9/25; H03H 9/6406; H03H 9/70; H03H 9/706; H03H 9/72; H03H 9/725; H01L 41/053

USPC ......................................................... 333/133
See application file for complete search history.

(56) References Cited

U.S. PATENT DOCUMENTS

| | | | | |
|---|---|---|---|---|
| 8,723,621 B2 * | 5/2014 | Kidoh | .................. | H03H 9/1064 |
| | | | | 333/133 |
| 8,875,362 B2 * | 11/2014 | Miyake | .................... | H03H 3/02 |
| | | | | 156/252 |

(Continued)

FOREIGN PATENT DOCUMENTS

| | | |
|---|---|---|
| JP | 2004-523949 A | 8/2004 |
| JP | 2007-67617 A | 3/2007 |

(Continued)

*Primary Examiner* — Barbara Summons
(74) *Attorney, Agent, or Firm* — Chen Yoshimura LLP

(57) ABSTRACT

A multiplexer includes: first and second substrate respectively having first and second surfaces facing each other across an air gap; a first filter including first resonators located on the first surface and connected between a common terminal and a first terminal; a second filter including second resonators located on the second surface and connected between the common terminal and a second terminal, a first resonator connected in series between the common terminal and the first terminal and closest to the common terminal overlapping with a second resonator connected in series between the common terminal and the second terminal and closest to the common terminal, first resonators other than the first resonator closest to the common terminal not overlapping with the second resonators, second resonators other than the second resonator closest to the common terminal not overlapping with the first resonators.

11 Claims, 16 Drawing Sheets

(56) References Cited

U.S. PATENT DOCUMENTS

| | | | |
|---|---|---|---|
| 2004/0029356 A1 | 2/2004 | Timme et al. | |
| 2007/0115079 A1* | 5/2007 | Kubo | B81C 1/00238 333/189 |
| 2009/0224851 A1 | 9/2009 | Feiertag et al. | |
| 2009/0289722 A1* | 11/2009 | Dropmann | H01L 23/66 330/303 |
| 2015/0123744 A1 | 5/2015 | Nishimura et al. | |
| 2019/0260351 A1* | 8/2019 | Itou | H03H 9/0566 |

FOREIGN PATENT DOCUMENTS

| | | |
|---|---|---|
| JP | 2008-546207 A | 12/2008 |
| JP | 2015-091065 A | 5/2015 |

* cited by examiner

MULTIPLEXER

CROSS-REFERENCE TO RELATED APPLICATION

This application is based upon and claims the benefit of priority of the prior Japanese Patent Application No. 2017-054823, filed on Mar. 21, 2017, the entire contents of which are incorporated herein by reference.

FIELD

A certain aspect of the present invention relates to a multiplexer.

BACKGROUND

It has been known to mount two substrates having filters formed thereon so that the surfaces having the filters formed thereon face each other across an air gap as disclosed in, for example, Japanese Patent Application Publication No. 2007-67617 (referred to as Patent Document 1, hereinafter). Patent Document 1 describes that the two filters are arranged so as to overlap with each other in plan view, and also describes that the two filters are arranged so as not to overlap with each other.

SUMMARY OF THE INVENTION

According to an aspect of the present invention, there is provided a multiplexer including: a first substrate having a first surface; a second substrate having a second surface facing the first surface across an air gap; a first filter including a plurality of first resonators, the plurality of first resonators being located on the first surface and connected between a common terminal and a first terminal; a second filter including a plurality of second resonators, the plurality of second resonators being located on the second surface and connected between the common terminal and a second terminal, at least a part of a first resonator connected in series between the common terminal and the first terminal and closest to the common terminal among the plurality of first resonators overlapping in plan view with at least a part of a second resonator connected in series between the common terminal and the second terminal and closest to the common terminal among the plurality of second resonators, at least one of first resonators other than the first resonator closest to the common terminal of the plurality of first resonators not overlapping with the plurality of second resonators in plan view, at least one of second resonators other than the second resonator closest to the common terminal of the plurality of second resonators not overlapping with the plurality of first resonators in plan view.

DETAILED DESCRIPTION

When two filters are arranged so as to overlap with each other, the filters interfere with each other, and thereby, the isolation characteristic deteriorates. When two filters are arranged so as not to overlap with each other, size reduction is difficult.

Hereinafter, a description will be given of embodiments of the present invention with reference to the accompanying drawings.

First Embodiment

Figure 1:
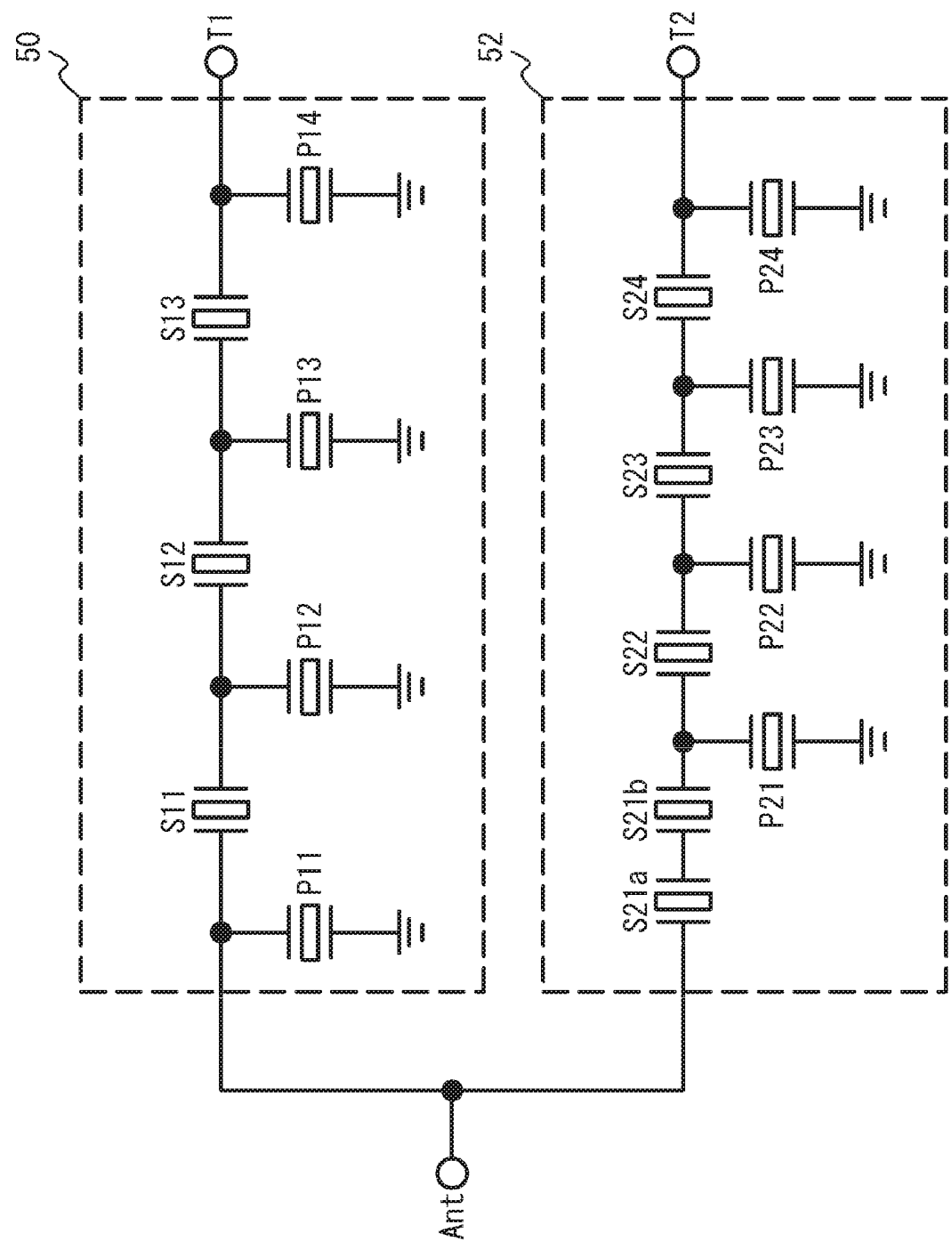
FIG. 1 is a circuit diagram of a multiplexer in accordance with a first embodiment.

FIG. 1 is a circuit diagram of a multiplexer in accordance with a first embodiment. As illustrated in FIG. 1, a filter 50 is connected between a common terminal Ant and a terminal T1. A filter 52 is connected between the common terminal Ant and a terminal T2. The filters 50 and 52 are respectively a transmit filter and a receive filter. The filters 50 and 52 have different passbands, and the passbands do not overlap with each other, for example. The filter 50 outputs signals in the transmit band to the common terminal Ant among high-frequency signals input to the terminal T1, and suppresses signals with other frequencies. The filter 52 outputs signals in the receive band to the terminal T2 among high-frequency signals input to the common terminal Ant, and suppresses signals with other frequencies.

The filter 50 is a ladder-type filter, and includes series resonators S11 through S13 and parallel resonators P11 through P14. The series resonators S11 through S13 are connected in series between the common terminal Ant and the terminal T1. The parallel resonators P11 through P14 are connected in parallel between the common terminal Ant and the terminal T1. The filter 52 is a ladder-type filter, and includes series resonators S21 through S24 and parallel resonators P21 through P24. The series resonators S21 through S24 are connected in series between the common terminal Ant and the terminal T2. The parallel resonators P21 through P24 are connected in parallel between the common terminal Ant and the terminal T2. The series resonator S21 is divided into a plurality of series resonators S21a and S21b.

Figure 2:
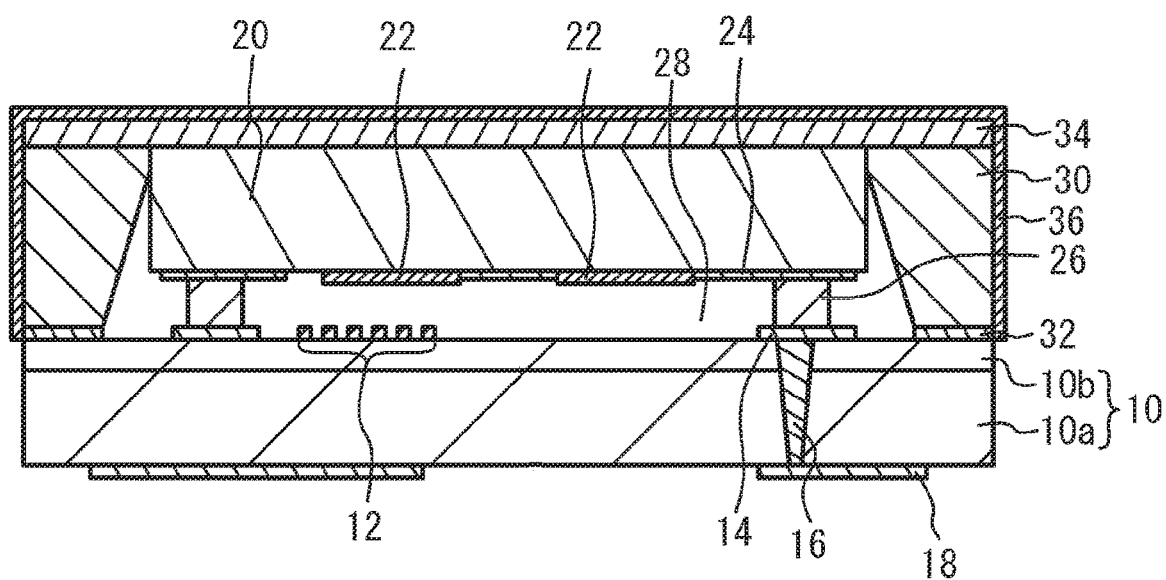
FIG. 2 is a cross-sectional view of the multiplexer of the first embodiment.

FIG. 2 is a cross-sectional view of the multiplexer of the first embodiment. As illustrated in FIG. 2, a substrate 20 is mounted on the substrate 10. The substrate 10 has a support substrate 10a and a piezoelectric substrate 10b. The support substrate 10a is, for example, a sapphire substrate, a spinel substrate, an alumina substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surfaces of the piezoelectric substrate 10b and the support substrate 10a are plane and flat.

Acoustic wave resonators 12 and wiring lines 14 are located on the upper surface of the substrate 10. Terminals 18 are located on the lower surface of the substrate 10. The terminals 18 are foot pads for connecting the acoustic wave resonators 12 and 22 to external devices. Via wirings 16 are provided so as to penetrate through the substrate 10. The via wiring 16 electrically connects the wiring line 14 with the terminal 18. The wiring lines 14, the via wirings 16, and the terminals 18 are formed of a metal layer such as, for example, a copper layer, an aluminum layer, or a gold layer. The terminals 18 include the common terminal Ant, the terminal T1, the terminal T2, and ground terminals.

Acoustic wave resonators 22 and wiring lines 24 are located on the lower surface of the substrate 20. The substrate 20 is, for example, a sapphire substrate, a spinel substrate, an alumina substrate, a glass substrate, or a silicon substrate. The wiring lines 24 are formed of a metal layer such as, for example, a copper layer, an aluminum layer, or a gold layer. The wiring lines 14 of the substrate 10 are bonded with the wiring lines 24 of the substrate 20 through bumps 26. The upper surface of the substrate 10 faces the lower surface of the substrate 20 across an air gap 28.

A ring-shaped electrode 32 is located in the periphery of the upper surface of the substrate 10. A sealing portion 30 is located on the substrate 10 so as to surround the substrate 20. The sealing portion 30 is bonded with the ring-shaped electrode 32. The sealing portion 30 is made of, for example, metal such as solder or an insulating material such as resin. A lid 34 is located on the upper surfaces of the substrate 20 and the sealing portion 30. The lid 34 is, for example, a metal plate made of kovar or an insulator plate. A protective film 36 is provided so as to cover the sealing portion 30 and the lid 34. The protective film 36 is, for example, a metal film made of nickel or an insulating film.

Figure 3A:
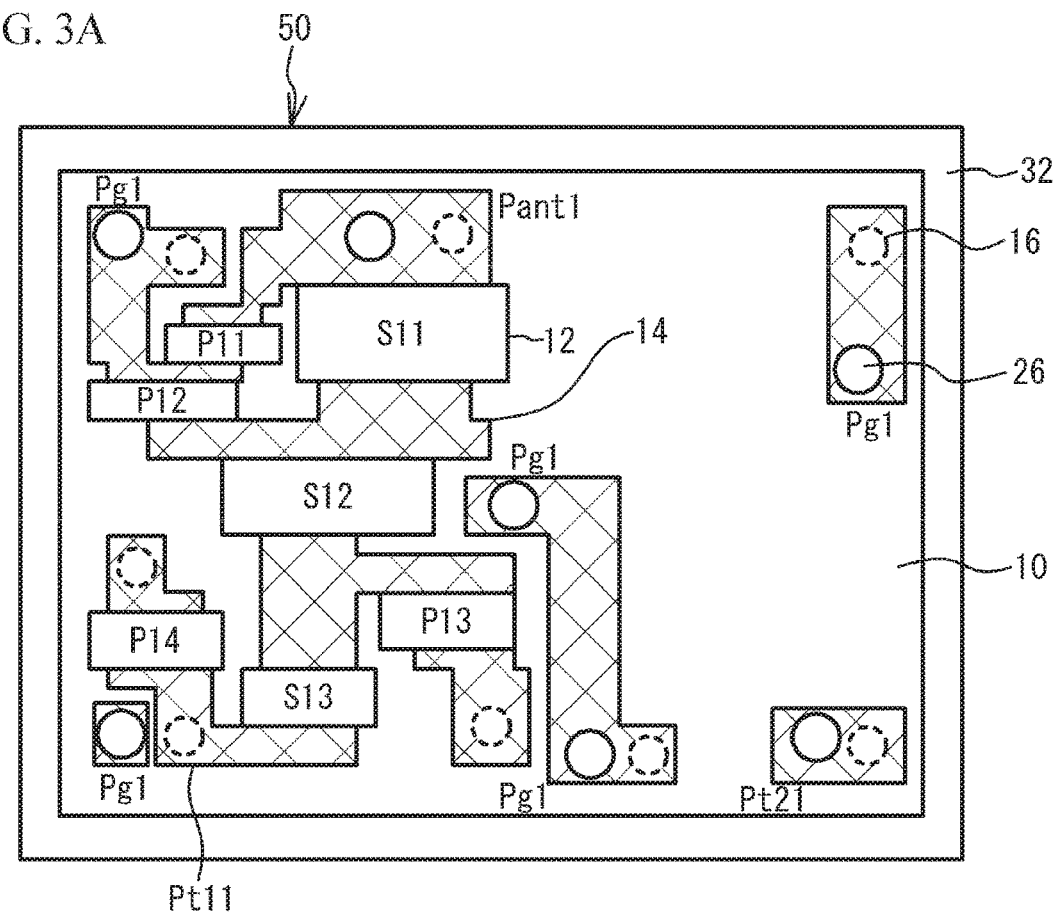
FIG. 3A is a plan view of the upper surface of a substrate 10 in the first embodiment.

FIG. 3A is a plan view of the upper surface of the substrate 10 in the first embodiment. As illustrated in FIG. 3A, located on the substrate 10 are the acoustic wave resonators 12, the wiring lines 14, and the ring-shaped electrode 32. The via wiring 16 and the bump 26 are coupled to the wiring line 14. Pads Pant1, Pt11, Pt21, and Pg1 are respectively coupled to the common terminal Ant, the terminal T1, the terminal T2 and ground terminals through the via wirings 16. Between the pads Pant1 and Pt11, the series resonators S11 through S13 are connected in series and the parallel resonators P11 through P14 are connected in parallel through the wiring lines 14. The series resonators S11 through S13 and the parallel resonators P11 through P14 form the filter 50.

Figure 3B:
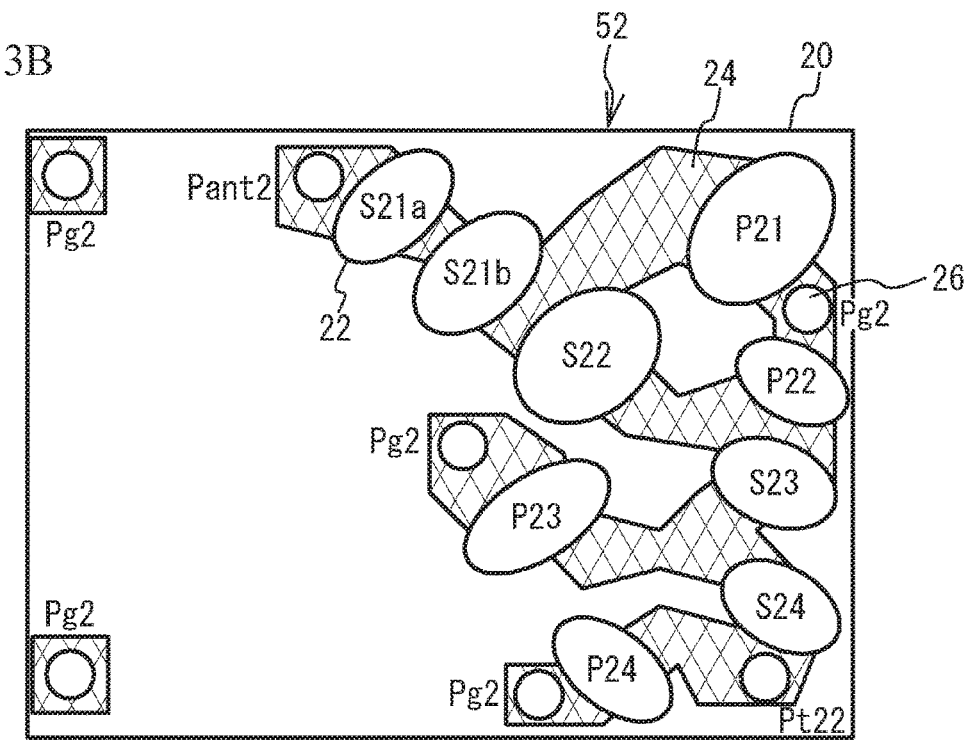
FIG. 3B is a transparent view of the lower surface of a substrate 20 as viewed from above.

FIG. 3B is a transparent view of the lower surface of the substrate 20 as viewed from above. As illustrated in FIG. 3B, the acoustic wave resonators 22 and the wiring lines 24 are located on the substrate 20. The bumps 26 are connected to the wiring lines 24. Pads Pant2, Pt22, and Pg2 are respectively coupled to the common terminal Ant, the terminal T2, and the ground terminals through the bumps 26, the wiring lines 14, and the via wirings 16. Between the pads Pant2 and Pt22, the series resonators S21a, S21b, and S22 through S24 are connected in series and the parallel resonators P21 through P24 are connected in parallel through the wiring lines 24. The series resonators S21 through S24 and the parallel resonators P21 through P24 form the filter 52.

Figure 4A:
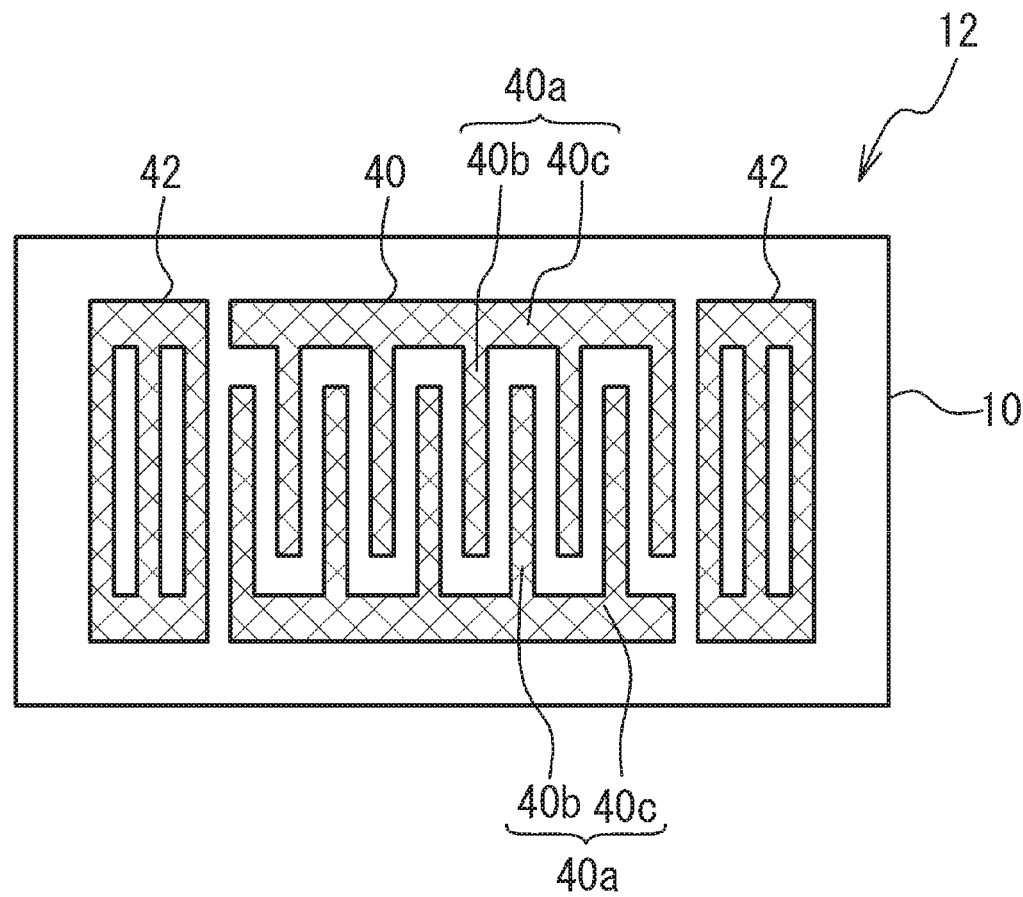
FIG. 4A is a plan view of an acoustic wave resonator 12 in the first embodiment.
Figure 4B:
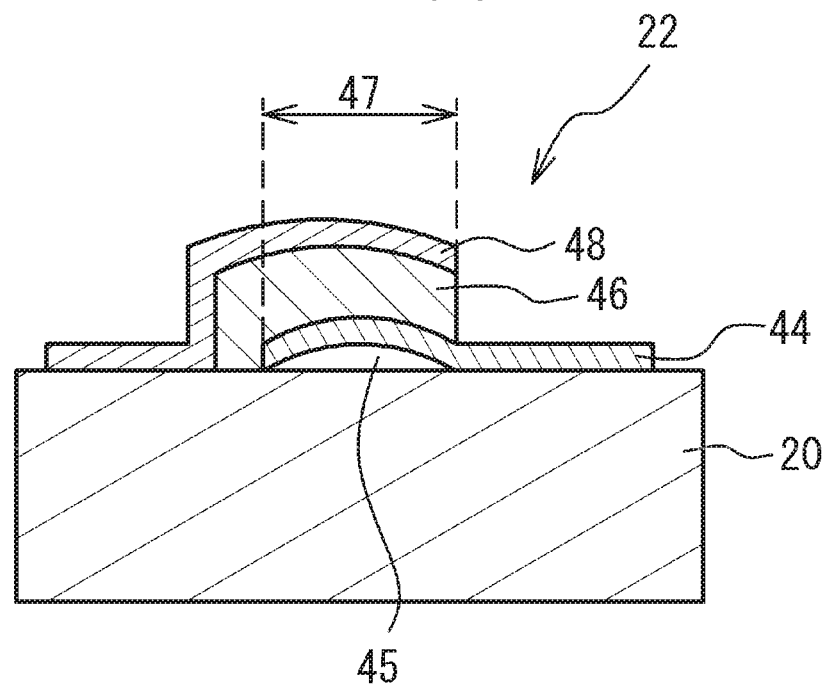
FIG. 4B is a cross-sectional view of an acoustic wave resonator 22 in the first embodiment.

FIG. 4A is a plan view of the acoustic wave resonator 12 in the first embodiment, and FIG. 4B is a cross-sectional view of the acoustic wave resonator 22 in the first embodiment. As illustrated in FIG. 4A, the acoustic wave resonator 12 is a surface acoustic wave resonator. An Interdigital Transducer (IDT) 40 and reflectors 42 are located on the piezoelectric substrate 10b of the substrate 10. The IDT 40 has a pair of comb-shaped electrodes 40a facing each other. The comb-shaped electrode 40a has a plurality of electrode fingers 40b and a bus bar 40c connecting the electrode fingers 40b. The reflectors 42 are located at both sides of the IDT 40. The IDT 40 excites a surface acoustic wave on the substrate 10. The IDT 40 and the reflectors 42 are formed of, for example, an aluminum film or a copper film. A protective film or a temperature compensation film may be located on the substrate 10 so as to cover the IDT 40 and the reflectors 42.

As illustrated in FIG. 4B, the acoustic wave resonator 22 is a piezoelectric thin film resonator. A piezoelectric film 46 is located on the substrate 20. A lower electrode 44 and an upper electrode 48 are provided so as to face each other across the piezoelectric film 46. An air gap 45 is formed between the lower electrode 44 and the substrate 20. The region where the lower electrode 44 and the upper electrode 48 face each other across at least a part of the piezoelectric film 46 is a resonance region 47. The lower electrode 44 and the upper electrode 48 in the resonance region 47 excite the acoustic wave in the thickness extension mode inside the piezoelectric film 46. The lower electrode 44 and the upper electrode 48 are formed of a metal film such as, for example, a ruthenium film. The piezoelectric film 46 is, for example, an aluminum nitride film. The acoustic wave resonators 12 and 22 include electrodes exciting the acoustic wave. Thus, the acoustic wave resonators 12 and 22 are covered with the air gap 28 so as not to restrain the excitation of the acoustic wave.

Figure 5:
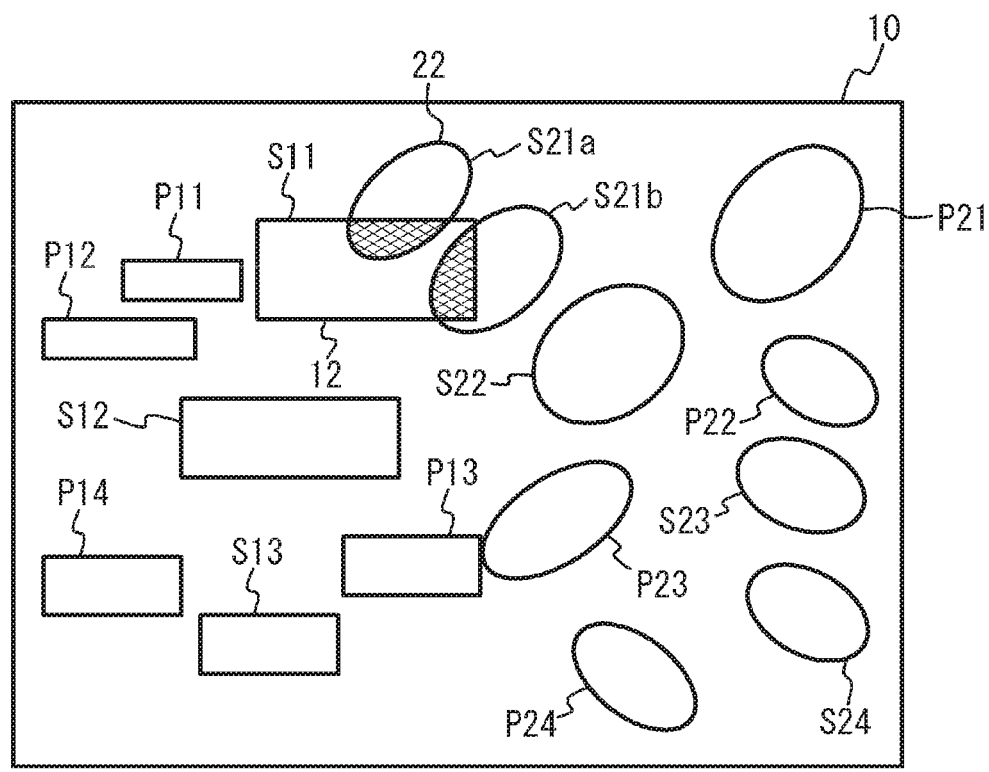
FIG. 5 is a diagram illustrating an overlap between the acoustic wave resonators 12 and 22 in plan view in the first embodiment.

FIG. 5 is a diagram illustrating an overlap between the acoustic wave resonators 12 and 22 in plan view in the first embodiment. The acoustic wave resonator 12 is defined by the region where the IDT 40 and the reflectors 42 are located in FIG. 4A, and the acoustic wave resonator 22 is defined by the resonance region 47 in FIG. 4B. As illustrated in FIG. 5, a part of each of the series resonators S21a and S21b overlaps with a part of the series resonator S11. The remaining acoustic wave resonators 12 and 22 do not overlap.

First Comparative Example

Figure 6:
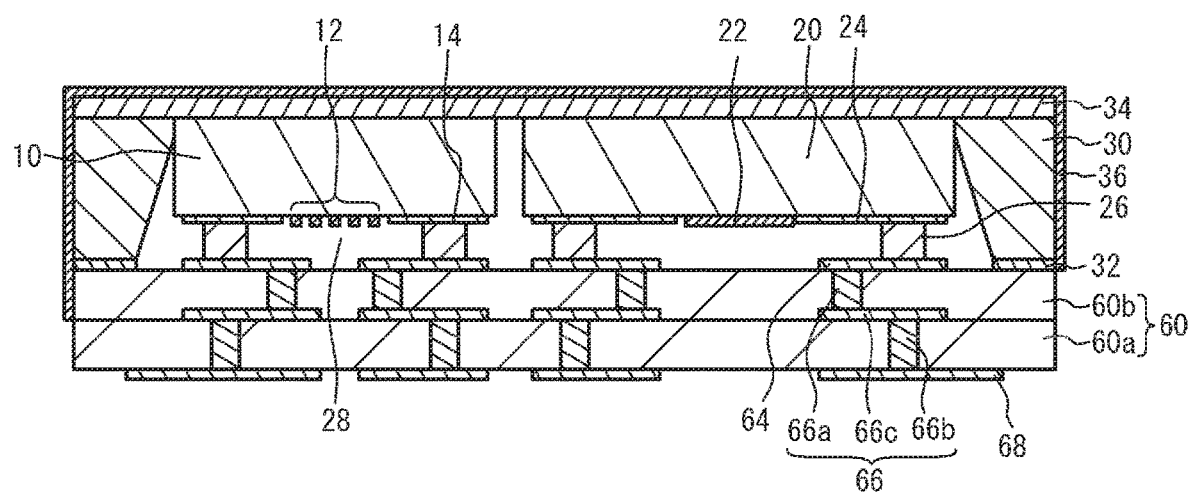
FIG. 6 is a cross-sectional view of a multiplexer in accordance with a first comparative example.

To examine the advantage of the first embodiment, multiplexers in accordance with the first embodiment and first through third comparative examples were fabricated. FIG. 6 is a cross-sectional view of a multiplexer in accordance with the first comparative example. As illustrated in FIG. 6, the substrates 10 and 20 are mounted on the substrate 60 through the bumps 26. The substrate 60 includes insulating layers 60a and 60b that are stacked. Wiring lines 64 are located on the upper surface of the substrate 60, and terminals 68 are located on the lower surface. An internal wiring line 66 includes via wirings 66a and 66b and a wiring line 66c, and electrically connects the wiring line 64 to the terminal 68.

Figure 7A:
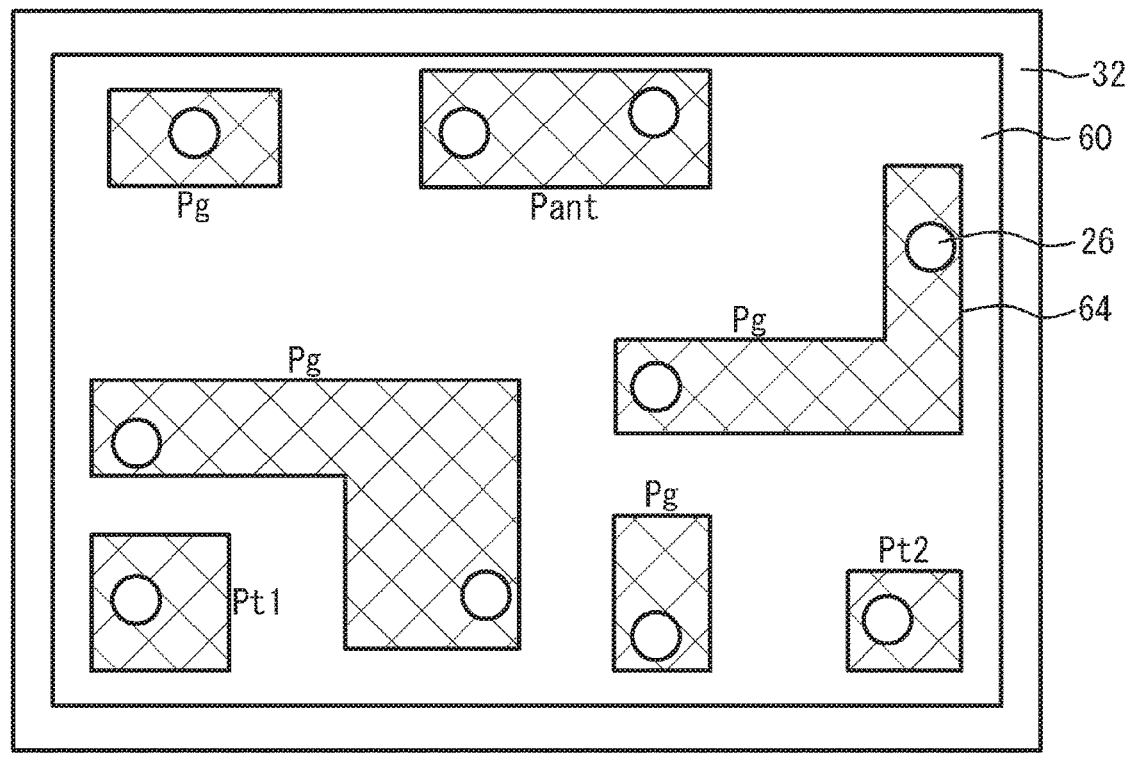
FIG. 7A is a plan view of the upper surface of a substrate 60 in the first comparative example.

FIG. 7A is a plan view of the upper surface of the substrate 60 in the first comparative example. As illustrated in FIG. 7A, the wiring lines 64 are located on the substrate 60. The pads Pant, Pt1, Pg2, and Pg1 are respectively connected to the common terminal Ant, the terminals T1 and T2, and the ground terminals through the wiring lines 64 and the internal wiring lines 66.

Figure 7B:
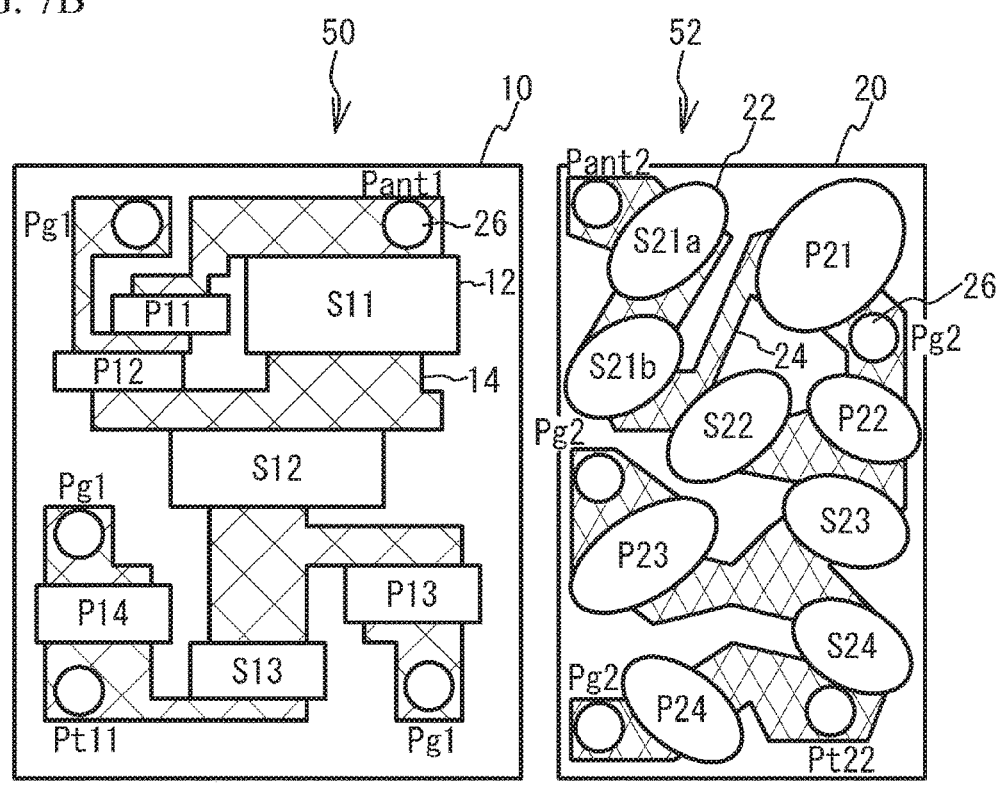
FIG. 7B is a transparent view of the lower surfaces of the substrates 10 and 20 as viewed from above.

FIG. 7B is a transparent view of the lower surfaces of the substrates 10 and 20 as viewed from above. As illustrated in FIG. 7B, the acoustic wave resonators 12 and the wiring lines 14 are located on the substrate 10. The bumps 26 are connected to the wiring lines 14. The pads Pant1, Pt11, and Pg1 are respectively coupled to the pads Pant, Pt1, and Pg through the bumps 26. The acoustic wave resonators 22 and the wiring lines 24 are located on the substrate 20. The bumps 26 are connected to the wiring lines 24. The pads Pant2, Pt22, and Pg2 are respectively coupled to the pads Pant, Pt2, and Pg through the bumps 26. Other structures are the same as those of the first embodiment, and the description thereof is thus omitted.

Second Comparative Example

Figure 8:
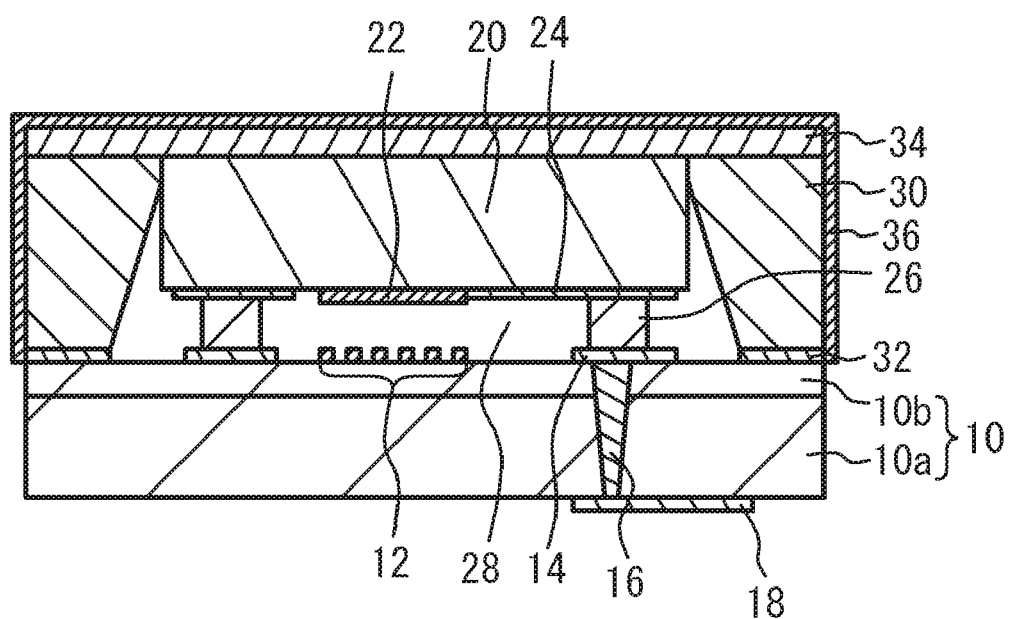
FIG. 8 is a cross-sectional view of a multiplexer in accordance with a second comparative example.
Figure 9A:
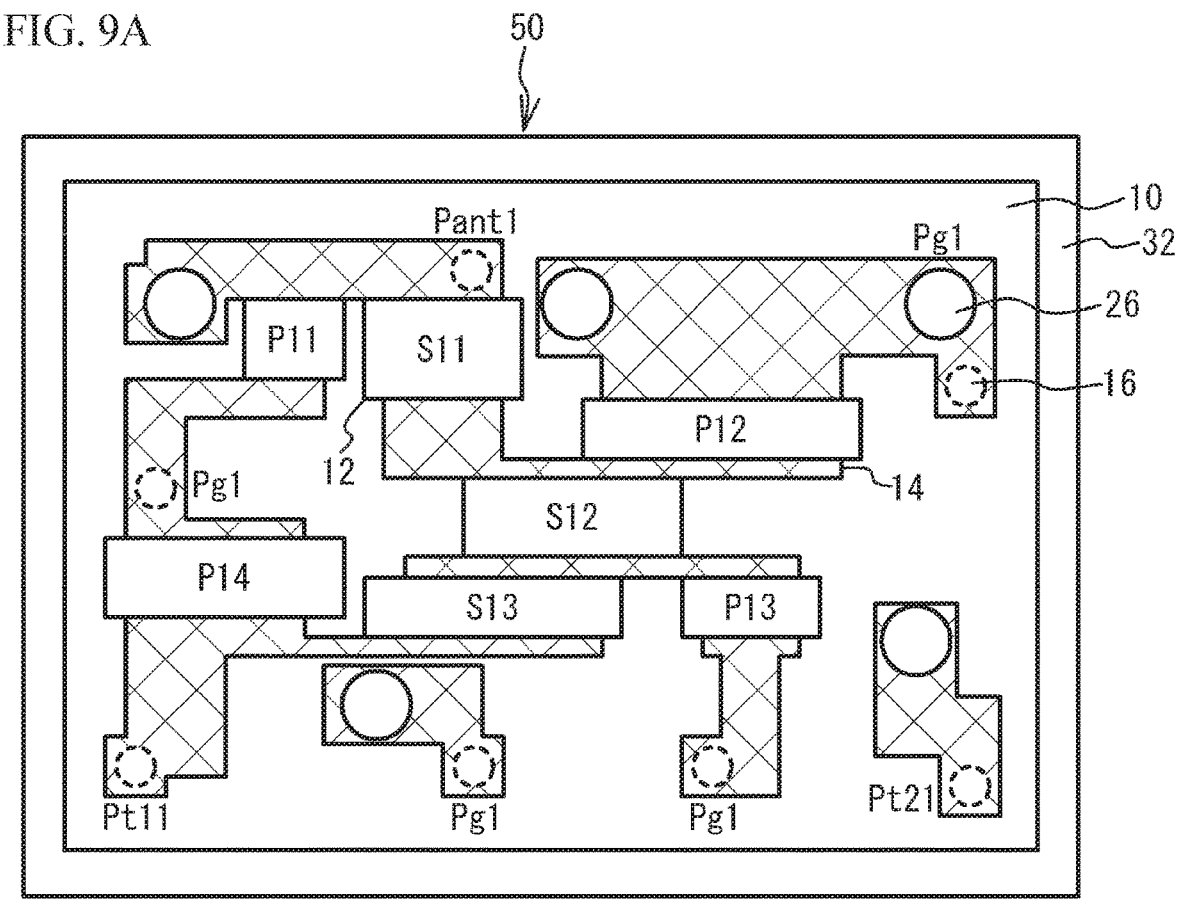
FIG. 9A is a plan view of the upper surface of the substrate 10 in the second comparative example.
Figure 9B:
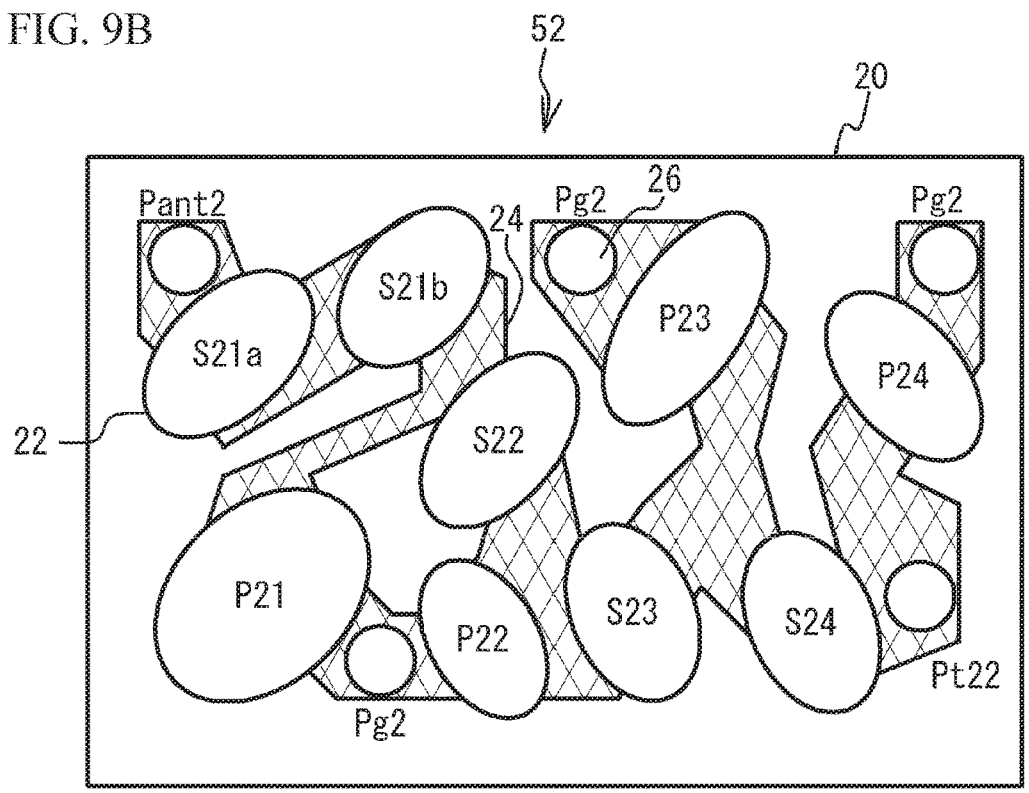
FIG. 9B is a transparent view of the lower surface of the substrate 20 as viewed from above.

FIG. 8 is a cross-sectional view of a multiplexer in accordance with the second comparative example. FIG. 9A is a plan view of the upper surface of the substrate 10 in the second comparative example, and FIG. 9B is a transparent view of the lower surface of the substrate 20 as viewed from above. As illustrated in FIG. 8 through FIG. 9B, in plan view, the acoustic wave resonators 12 and 22 are arranged so as to overlap with each other. Other structures are the same as those of the first embodiment, and the description thereof is thus omitted.

Third Comparative Example

Figure 10:
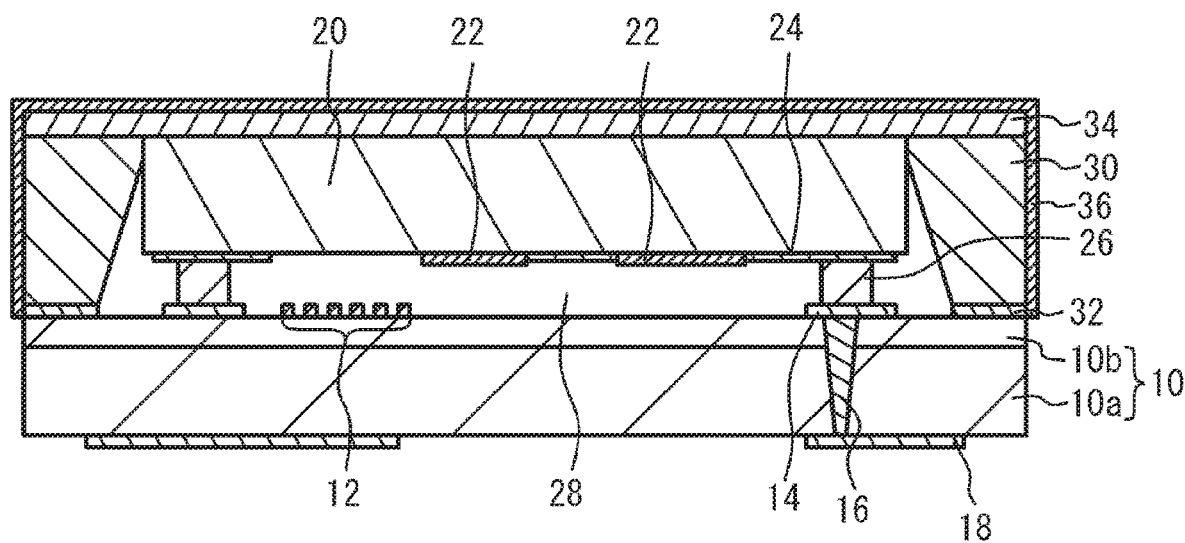
FIG. 10 is a cross-sectional view of a multiplexer in accordance with a third comparative example.
Figure 11A:
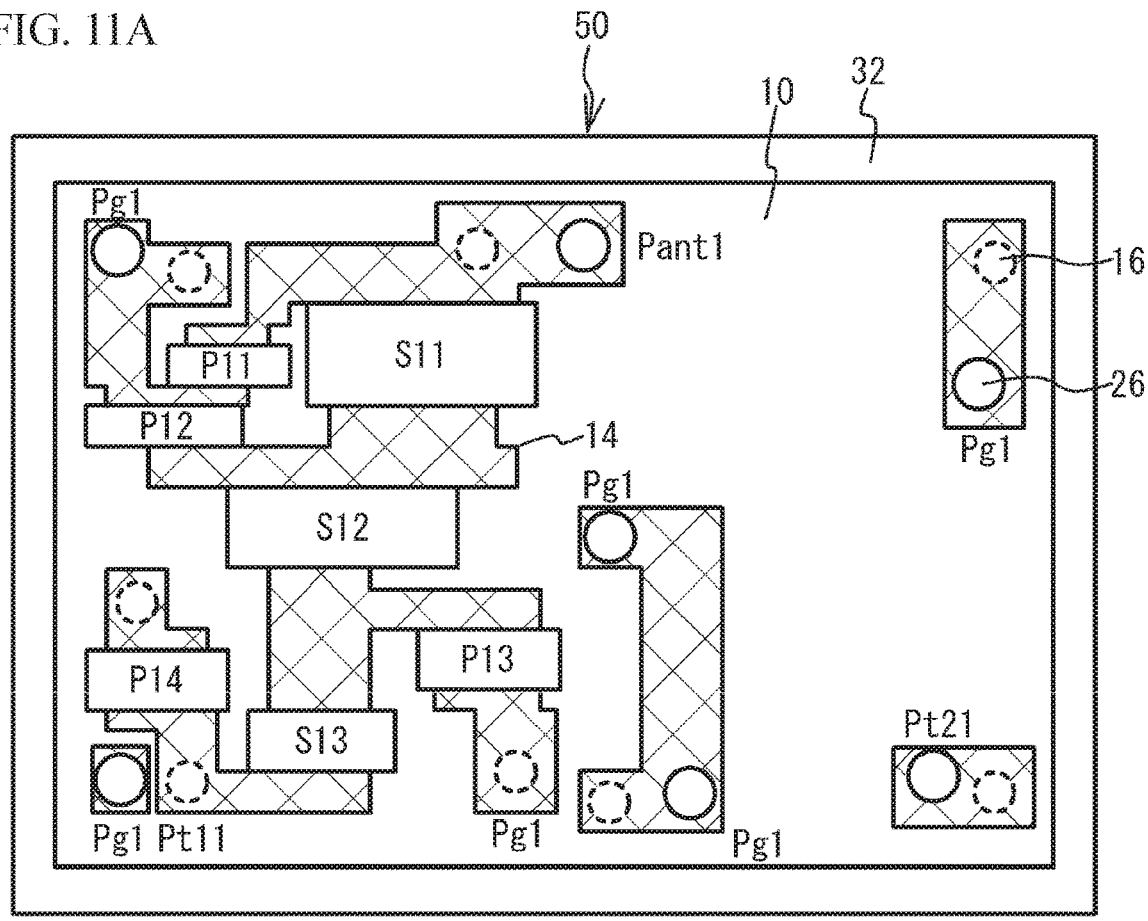
FIG. 11A is a plan view of the upper surface of the substrate 10 in accordance with the third comparative example.
Figure 11B:
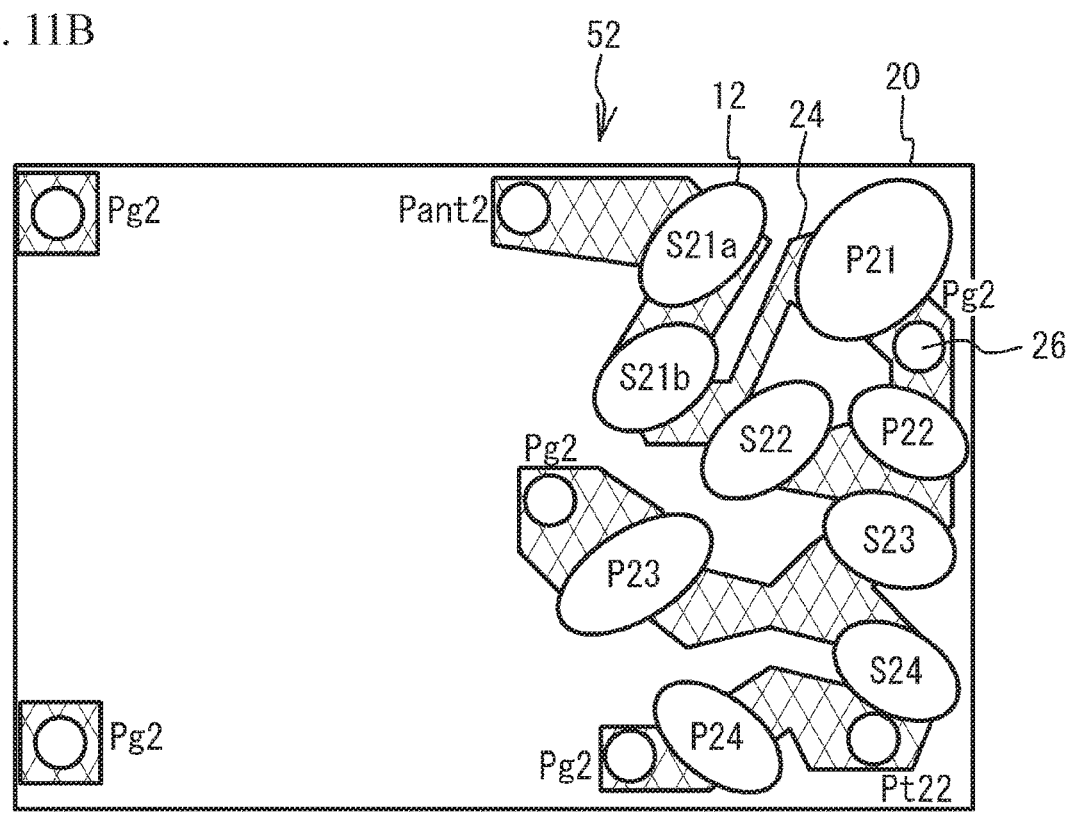
FIG. 11B is a transparent view of the lower surface of the substrate 20 as viewed from above.

FIG. 10 is a cross-sectional view of a multiplexer in accordance with the third comparative example. FIG. 11A is a plan view of the upper surface of the substrate 10 in the third comparative example, and FIG. 11B is a transparent view of the lower surface of the substrate 20 as viewed from above. As illustrated in FIG. 10 through FIG. 11B, the acoustic wave resonators 12 and 22 do not overlap with each other in plan view. Other structures are the same as those of the first embodiment, and the description thereof is thus omitted.

Figure 12:
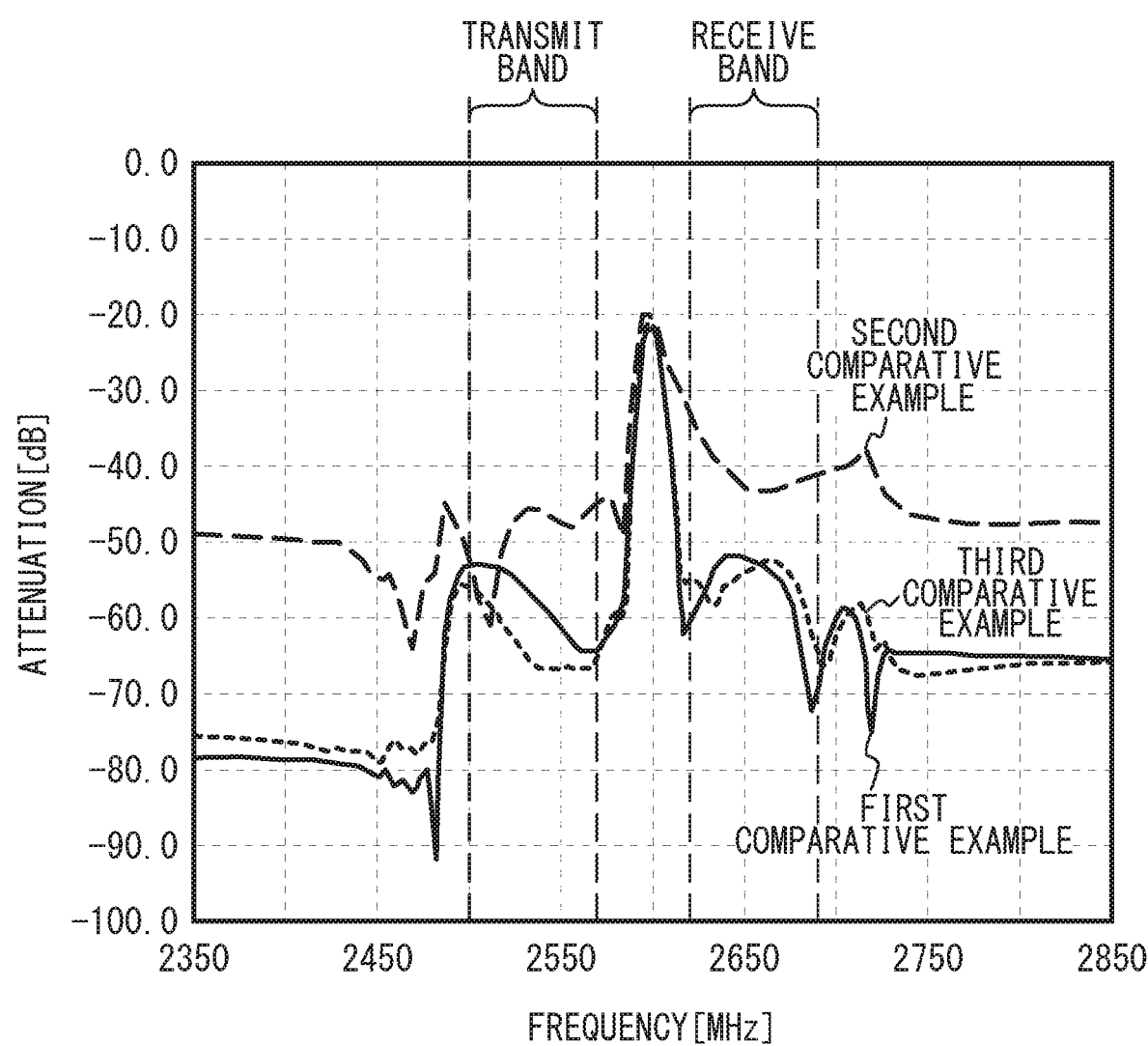
FIG. 12 illustrates isolation characteristics in the first through third comparative examples.

For the first embodiment and the first through third comparative examples, measured were isolation characteristics from the terminal T1 (a transmit terminal) to the terminal T2 (a receive terminal). The fabrication conditions for the first embodiment and the first through third comparative examples are as follows.
Filter 50: Receive filter for Band7
Filter 52: Transmit filter for Band7
Support substrate 10a: Sapphire substrate with a thickness of 100 μm
Piezoelectric substrate 10b: Lithium tantalate substrate with a film thickness of 20 nm Acoustic wave resonator 12: Surface acoustic wave resonator
Wiring line 14: Gold layer with a film thickness of 1 μm
Via wiring 16: Copper layer
Terminal 18: Copper layer with a film thickness of 2.5 μm, a nickel layer with a film thickness of 5 μm, and a gold layer with a film thickness of 1 μm staked in this order from the substrate 10 side
Substrate 20: Silicon substrate with a thickness of 150 μm
Acoustic wave resonator 22: Piezoelectric thin film resonator having a piezoelectric film made of aluminum nitride
Wiring line 24: Gold layer with a film thickness of 1 μm
Bump 26: Gold bump with a height of 15 μm
Sealing portion 30: Tin silver solder
Ring-shaped electrode 32: Nickel film with a film thickness of 5 μm
Lid 34: Kovar with a thickness of 20 μm
Protective film 36: Nickel film with a film thickness of 10 μm The conditions for the first comparative example are as follows.
Substrate 10: Lithium tantalate substrate with a thickness of 150 μm
Insulating layers 60a and 60b: Alumina ceramic with a film thickness of 75 μm
Wiring line 64: Flash gold plated tungsten layer with a film thickness of 20 μm
Internal wiring line 66: Tungsten layer
Terminal 68: Flash gold plated tungsten layer with a film thickness of 20 μm FIG. 12 illustrates isolation characteristics in the first through third comparative examples. As illustrated in FIG. 12, in the first comparative example, the isolation characteristic is good. In the second comparative example, the isolation characteristic is bad. The reason is as follows. In the first comparative example, the acoustic wave resonators 12 and 22 do not overlap in plan view, while in the second comparative example, the acoustic wave resonators 12 and 22 overlap in plan view. As clear from the third comparative example, even when the substrate 20 is mounted on the substrate 10, if the acoustic wave resonators 12 and 22 do not overlap, the isolation characteristic is approximately the same as that of the first comparative example. However, when the acoustic wave resonators 12 and 22 do not overlap, the plane sizes of the substrates 10 and 20 need to be large, and the size reduction is thereby difficult.

Figure 13A:
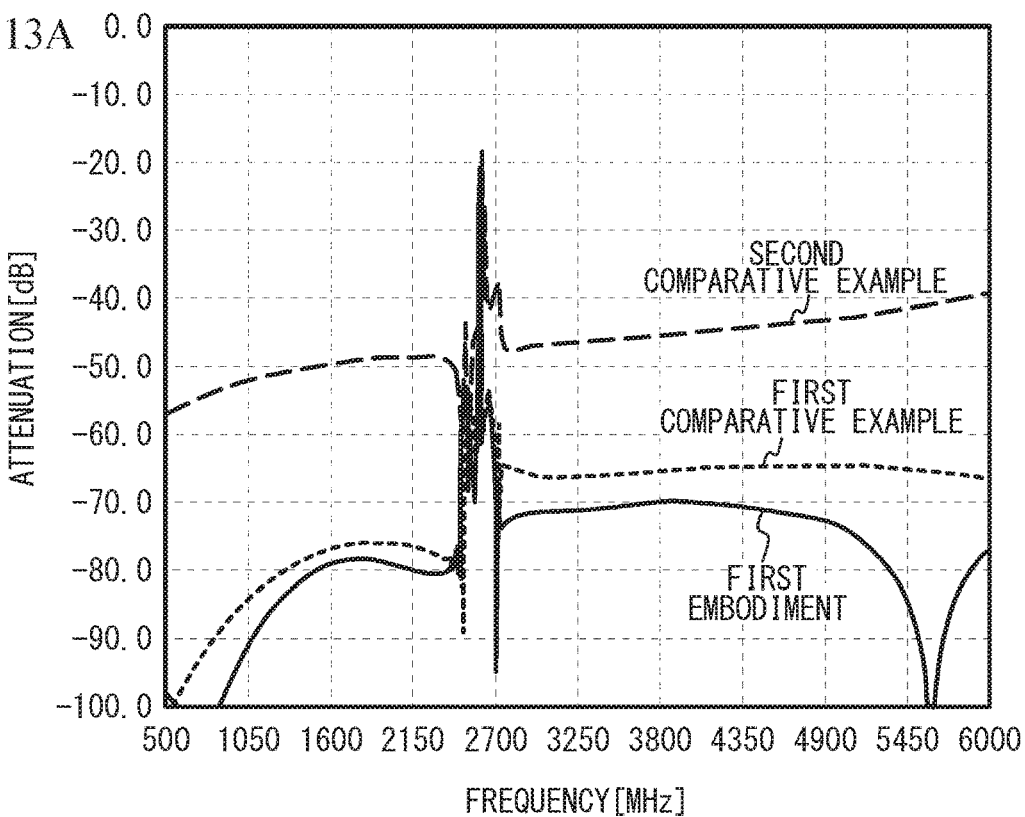
FIG. 13A and FIG. 13B illustrate isolation characteristics in the first embodiment and the first and second comparative examples.
Figure 13B:
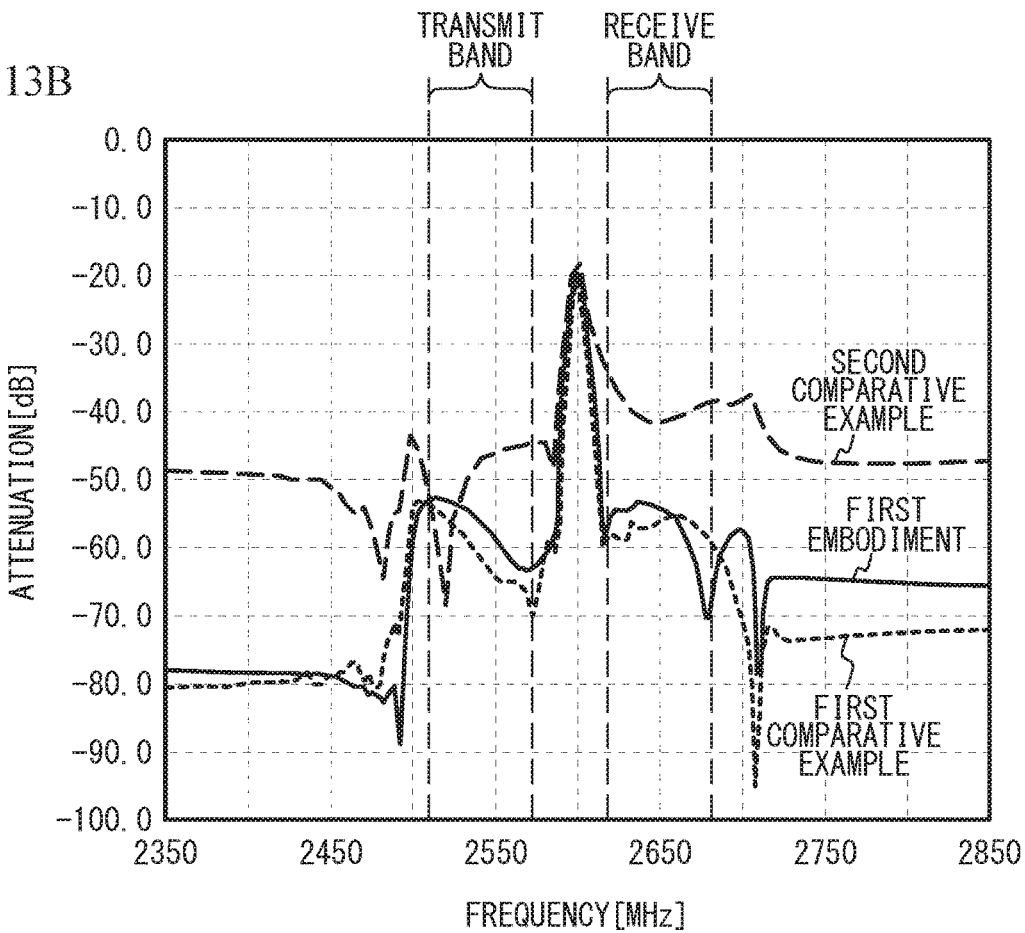

FIG. 13A and FIG. 13B illustrate isolation characteristics in the first embodiment and the first and second comparative examples. FIG. 13A illustrates frequency characteristics in a wide band, and FIG. 13B illustrates the frequency characteristics near the passbands. As illustrated in FIG. 13A, in the wide band, the first embodiment has a better isolation characteristic than the first comparative example. As illustrated in FIG. 13B, in the receive band, the first embodiment has approximately the same isolation characteristic as the first comparative example.

In the first embodiment, the upper surface (a first surface) of the substrate 10 (a first substrate) faces the lower surface (a second surface) of the substrate 20 (a second substrate) across the air gap 28. An electric potential approximately identical to an electric potential applied to the common terminal Ant is applied to the series resonator S11 that is connected in series between the common terminal Ant and the terminal T1 and is closest to the common terminal Ant among the acoustic wave resonators 12 (first resonators) of the filter 50 (a first filter) connected between the common terminal Ant and the terminal T1 (i.e., the acoustic wave resonator 12 connected to the common terminal Ant in the acoustic wave resonators 12, where no acoustic wave resonators 12 are connected in series between the acoustic wave resonator 12 connected to the common terminal Ant and the common terminal Ant). An electric potential approximately identical to an electric potential applied to the common terminal Ant is applied to the series resonator S21 that is connected in series between the common terminal Ant and the terminal T2 and is closest to the common terminal Ant among the acoustic wave resonators 22 of the filter 52 (a second filter) connected between the common terminal Ant and the terminal T2 (i.e., the acoustic wave resonator 22 connected to the common terminal Ant in the acoustic wave resonators 22, where no acoustic wave resonators 22 are connected in series between the acoustic wave resonator 22 connected to the common terminal Ant and the common terminal Ant). Thus, at least a part of the series resonator S11 is made to overlap with at least a part of the series resonator S21 in plan view. Since approximately identical electric potentials are applied to the series resonators S11 and S21, the series resonators S11 and S21 hardly interfere with each other even when overlapping in plan view. In addition, even when transmission signals leak from the filter 50 to the filter 52 near the common terminal Ant, the leak transmission signal is attenuated by the subsequent acoustic wave resonators 22 of the filter 52. Thus, the isolation characteristic hardly deteriorates.

The acoustic wave resonators 12 other than the series resonator S11 of the acoustic wave resonators 12 do not overlap with the acoustic wave resonators 22 in plan view. In addition, the acoustic wave resonators 22 other than the series resonator S21 of the acoustic wave resonators 22 do not overlap with the acoustic wave resonators 12 in plan view. Thus, the interference between the filters 50 and 52 is reduced, and the isolation characteristic does not deteriorate. Thus, the isolation characteristic approximately the same as that of the first comparative example is achieved. Since a part of the acoustic wave resonator 12 overlaps with a part of the acoustic wave resonator 22, the size is reduced compared to the third comparative example.

To reduce the deterioration of the isolation characteristic, none of the acoustic wave resonators 12 other than the series resonator S11 of the acoustic wave resonators 12 preferably overlaps with the acoustic wave resonators 22 in plan view. In addition, none of the acoustic wave resonators 22 other than the series resonator S21 of the acoustic wave resonators 22 preferably overlaps with the acoustic wave resonators 12 in plan view.

To reduce the size, one or some of the acoustic wave resonators 12 other than the series resonator S11 of the acoustic wave resonators 12 preferably do not overlap with the acoustic wave resonators 22 in plan view. In addition, one or some of the acoustic wave resonators 22 other than the series resonator S21 of the acoustic wave resonators 22 preferably do not overlap with the acoustic wave resonators 12 in plan view.

The series resonator S13 and the parallel resonator P14 that are closest to the terminal T1 among the acoustic wave resonators 12 tend to interfere with the filter 52. In addition, the series resonator S24 and the parallel resonator P24 that are closest to the terminal T2 among the acoustic wave resonators 22 tend to interfere with the filter 52. Thus, the series resonator S13 and the parallel resonator P14 that are closest to the terminal T1 among the acoustic wave resonators 12 preferably do not overlap with the acoustic wave resonators 22. In addition, the series resonator S24 and the parallel resonator P24 of the acoustic wave resonators 22 preferably do not overlap with the acoustic wave resonators 12.

When the filters 50 and 52 have different passbands, the interference between the filters 50 and 52 becomes a problem. Thus, as described in the first embodiment, in the acoustic wave resonators 12 and 22, at least a part of the acoustic wave resonator 12 having an electric potential approximately identical to that of the common terminal Ant and at least a part of the acoustic wave resonator 22 having an electric potential approximately identical to that of the common terminal Ant are preferably made to overlap, and the remaining acoustic wave resonators 12 and 22 are preferably made not to overlap with each other.

The series resonators S21a and S21b face the series resonator S11 only across the air gap 28 without another substrate and/or a metal layer. In this structure, the interference between the filters 50 and 52 becomes a problem. Thus, as described in the first embodiment, in the acoustic wave resonators 12 and 22, at least a part of the acoustic wave resonator 12 having an electric potential approximately identical to that of the common terminal Ant and at least a part of the acoustic wave resonator 22 having an electric potential approximately identical to that of the common terminal Ant are preferably made to overlap, and the remaining acoustic wave resonators 12 and 22 are preferably made not to overlap.

A case where the acoustic wave resonators 12 and 22 are respectively surface acoustic wave resonators and piezoelectric thin film resonators has been described, but both the acoustic wave resonators 12 and 22 may be surface acoustic wave resonators or piezoelectric thin film resonators.

First Variation of the First Embodiment

Figure 14:
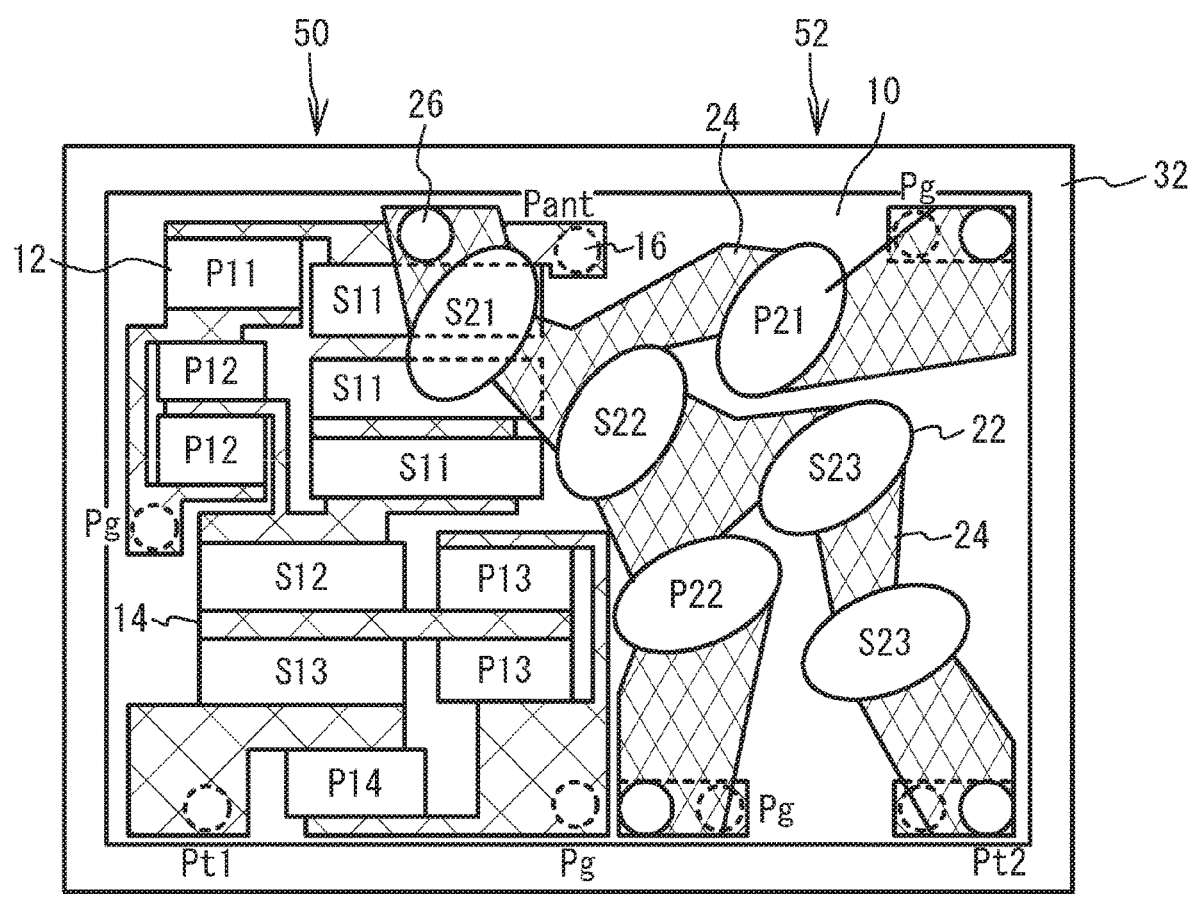
FIG. 14 is a plan view of a multiplexer in accordance with a first variation of the first embodiment.

FIG. 14 is a plan view of a multiplexer in accordance with a first variation of the first embodiment. The acoustic wave resonators 22 and the wiring lines 24 on the substrate 20 are illustrated on the substrate 10 in a superimposed manner. As illustrated in FIG. 14, the acoustic wave resonators 12 and the wiring lines 14 are located on the upper surface of the substrate 10. Between the pads Pant and Pt1, the series resonators S11 through S13 are connected in series and the parallel resonators P11 through P14 are connected in parallel. The series resonator S11 is serially divided into three. Each of the parallel resonators P12 and P13 is divided into two in parallel. The acoustic wave resonators 22 and the wiring lines 24 are located on the lower surface of the substrate 20. Between the pads Pant and Pt2, the series resonators S21 through S23 are connected in series and the parallel resonators P21 and P22 are connected in parallel. The series resonator S23 is serially divided into two series resonators S23. A part of the series resonator S11 and a part of the series resonator S21 overlap in plan view. Other structures are the same as those of the first embodiment, and the description thereof is thus omitted.

Second Variation of the First Embodiment

Figure 15:
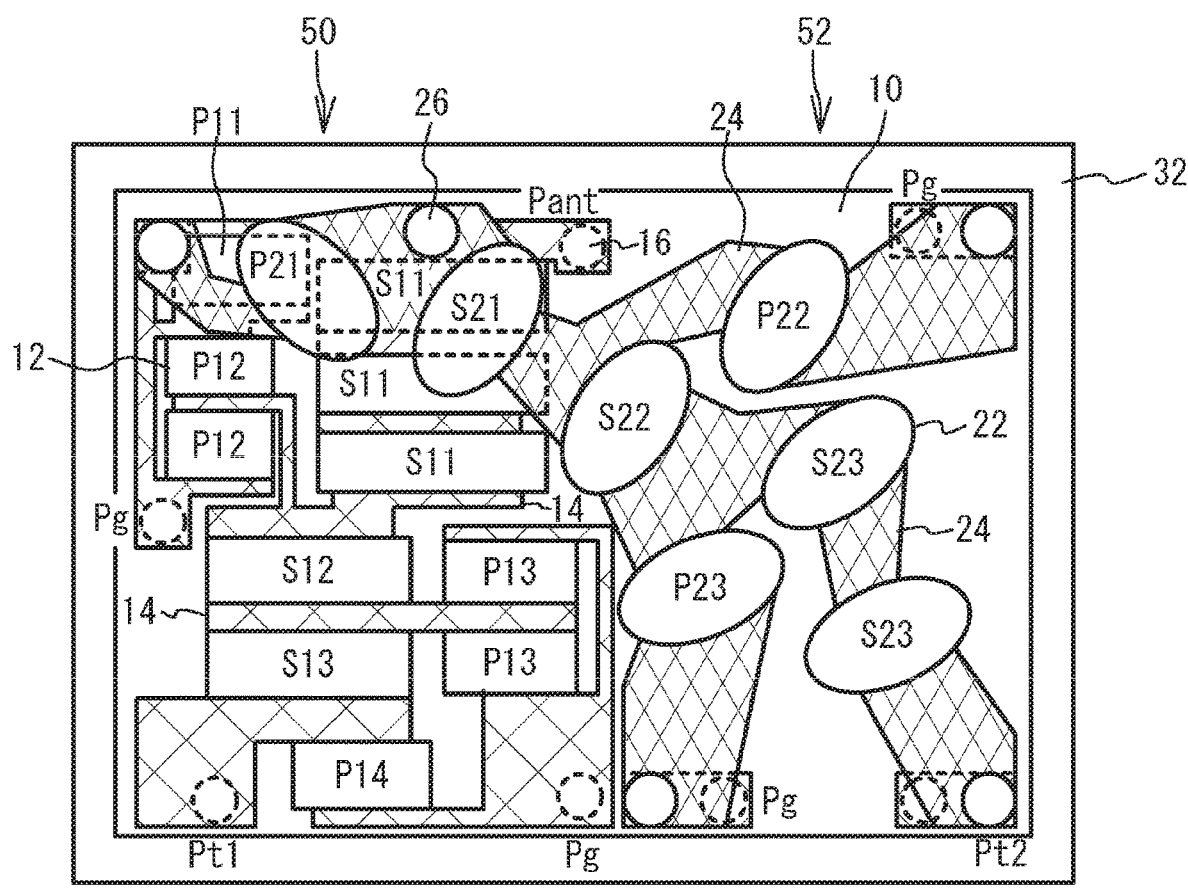
FIG. 15 is a plan view of a multiplexer in accordance with a second variation of the first embodiment.

FIG. 15 is a plan view of a multiplexer in accordance with a second variation of the first embodiment. The acoustic wave resonators 22 and the wiring lines 24 on the substrate 20 are illustrated on the substrate 10 in a superimposed manner. As illustrated in FIG. 15, a part of the parallel resonator P11 overlaps with a part of the parallel resonator P21, and a part of the series resonator S11 overlaps with a part of the parallel resonator P21 and a part of the series resonator S21. Other structures are the same as those of the first variation of the first embodiment, and the description thereof is thus omitted.

Third Variation of the First Embodiment

Figure 16:
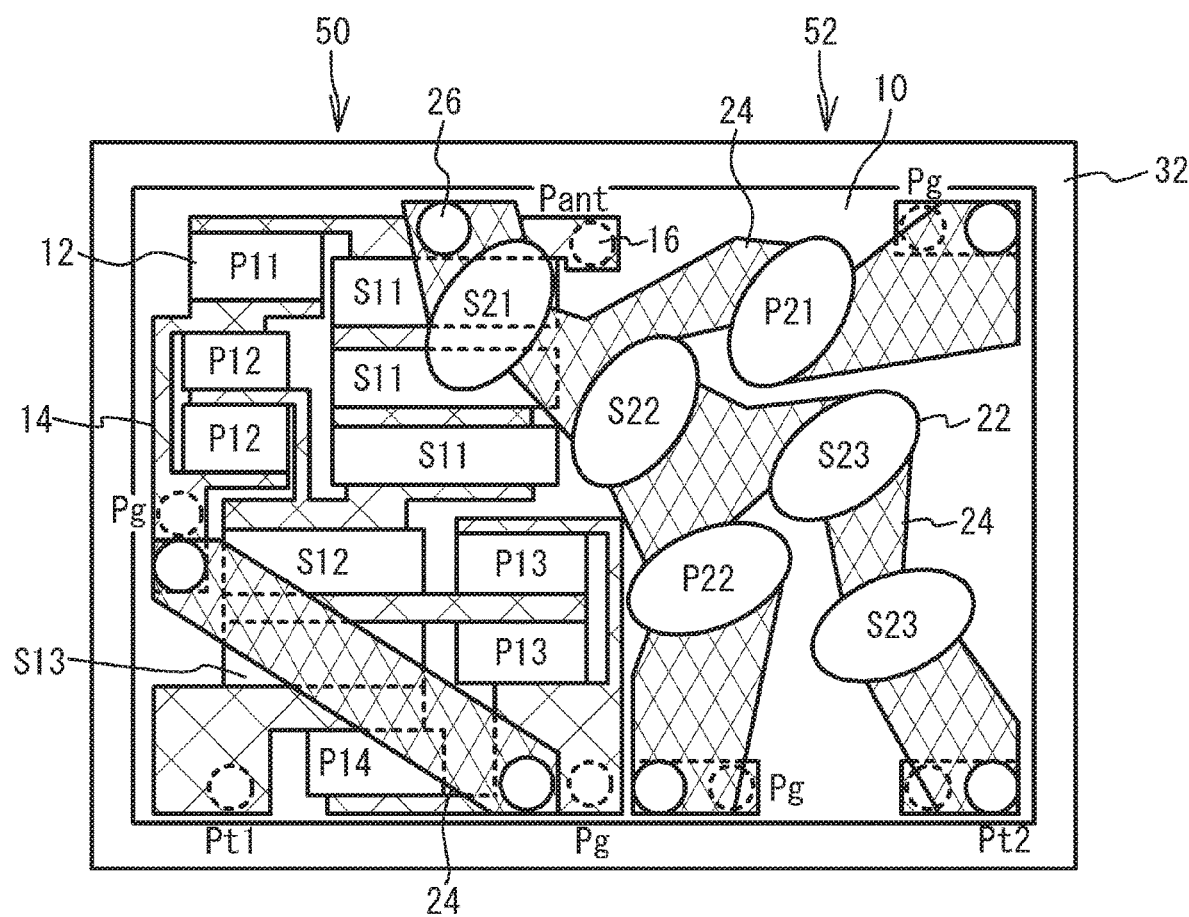
FIG. 16 is a plan view of a multiplexer in accordance with a third variation of the first embodiment.

FIG. 16 is a plan view of a multiplexer in accordance with a third variation of the first embodiment. The pads of the filter 50 formed on the substrate 10 are interconnected through the wiring lines 24 of the substrate 20. Other structures are the same as those of the first variation of the first embodiment, and the description thereof is thus omitted.

As described in the first embodiment and the variations thereof, the filters 50 and 52 may be ladder-type filters including one or more series resonators connected in series between the common terminal Ant and the terminal T1 (or T2) and one or more parallel resonators connected in parallel between the common terminal Ant and the terminal T1 (or T2).

In the ladder-type filter, high-frequency signals mainly pass through the series resonators. Thus, as described in the first embodiment and the variations thereof, the series resonator S11 closest to the common terminal Ant preferably does not overlap with the acoustic wave resonators 22 in plan view. In addition, the series resonator S21 closest to the common terminal Ant preferably does not overlap with the acoustic wave resonators 12 in plan view.

To reduce the size, at least one of the series resonators S12 and S13 other than the series resonator S11 closest to the common terminal Ant preferably does not overlap with the acoustic wave resonators 22 in plan view. At least one of the series resonators S22 through S24 other than the series resonator S21 closest to the common terminal Ant preferably does not overlap with the acoustic wave resonators 12 in plan view.

As described in the second variation of the first embodiment, an electric potential approximately identical to that of the common terminal Ant is applied to the parallel resonator P11, and an electric potential approximately identical to that of the common terminal Ant is applied to the parallel resonator P21. At this time, at least a part of the parallel resonator P11 may overlap with at least a part of the series resonator S21 and at least a part of the parallel resonator P21. At least a part of the parallel resonator P21 may overlap with at least a part of the series resonator S11 and at least a part of the parallel resonator P11.

As described in the first embodiment, the series resonator S21 overlapping with the acoustic wave resonator 12 may be divided in series or in parallel. As described in the variations of the first embodiment, the series resonator S21 overlapping with the acoustic wave resonator 12 may not be necessarily divided. The parallel resonators P11 and P21 may be divided or may not be necessarily divided. The remaining resonators may be divided or may not be necessarily divided. The number of series resonators and parallel resonators constituting a ladder-type filter may be freely selected.

The first embodiment and the variations thereof have described a case where the filters 50 and 52 are ladder-type filters, but at least one of the filters 50 and 52 may include a multimode filter. When the acoustic wave resonator 12 includes a multimode filter, the acoustic wave resonator 12 that is closest to the common terminal Ant and overlaps with the acoustic wave resonator 22 may be a multimode filter. When the acoustic wave resonator 22 includes a multimode filter, the acoustic wave resonator 22 that is closest to the common terminal Ant and overlaps with the acoustic wave resonator 12 may be a multimode filter.

A case where the sealing portion 30 is located so as to surround the substrate 20 has been described, but the sealing portion 30 may not be necessarily provided.

Although the embodiments of the present invention have been described in detail, it is to be understood that the various change, substitutions, and alterations could be made hereto without departing from the spirit and scope of the invention.

What is claimed is:

1. A multiplexer comprising:
   a first substrate having a first surface;
   a second substrate having a second surface facing the first surface across an air gap;
   a first filter including a plurality of first resonators, the plurality of first resonators being located on the first surface and connected between a common terminal and a first terminal;
   a second filter including a plurality of second resonators, the plurality of second resonators being located on the second surface and connected between the common terminal and a second terminal, at least a part of a first resonator connected in series between the common terminal and the first terminal and closest to the common terminal among the plurality of first resonators overlapping in plan view with at least a part of a second resonator connected in series between the common terminal and the second terminal and closest to the common terminal among the plurality of second resonators, at least one of first resonators other than the first resonator closest to the common terminal of the plurality of first resonators not overlapping with the plurality of second resonators in plan view, at least one of second resonators other than the second resonator closest to the common terminal of the plurality of second resonators not overlapping with the plurality of first resonators in plan view.

2. The multiplexer according to claim 1, wherein a passband of the first filter differs from a passband of the second filter.

3. The multiplexer according to claim 1, wherein
   a first resonator closest to the first terminal among the plurality of first resonators does not overlap with the plurality of second resonators in plan view, and
   a second resonator closest to the second terminal among the plurality of second resonators does not overlap with the plurality of first resonators in plan view.

4. The multiplexer according to claim 1, wherein
   in the plurality of first resonators, a first resonator other than the first resonator closest to the common terminal does not overlap with the plurality of second resonators in plan view, and
   in the plurality of second resonators, a second resonator other than the second resonator closest to the common terminal does not overlap with the plurality of first resonators in plan view.

5. The multiplexer according to claim 1, wherein the first resonator closest to the common terminal and the second resonator closest to the common terminal face each other only across the air gap.

6. The multiplexer according to claim 1, wherein the plurality of first resonators and the plurality of second resonators are acoustic wave resonators.

7. The multiplexer according to claim 1, wherein
   the plurality of first resonators include one or more first series resonators connected in series between the common terminal and the first terminal and one or more first parallel resonators connected in parallel between the common terminal and the first terminal, and the first resonator closest to the common terminal includes a first series resonator closest to the common terminal among the one or more first series resonators.

8. The multiplexer according to claim 7, wherein the plurality of second resonators include one or more second series resonators connected in series between the common terminal and the second terminal and one or more second parallel resonators connected in parallel between the common terminal and the second terminal, and the second resonator closest to the common terminal includes a second series resonator closest to the common terminal among the one or more second series resonators.

9. The multiplexer according to claim 7, wherein the one or more first series resonators include a plurality of first series resonators, in the plurality of first series resonators, at least one of first series resonators other than the first series resonator closest to the common terminal does not overlap with the plurality of second resonators in plan view.

10. The multiplexer according to claim 7, wherein at least a part of the first parallel resonator closest to the common terminal among the one or more first parallel resonators overlaps in plan view with at least a part of the second resonator closest to the common terminal.

11. The multiplexer according to claim 1, wherein the first resonator closest to the common terminal is a first resonator connected to the common terminal in the plurality of first resonators, no first resonators being connected in series between the common terminal and the first resonator connected to the common terminal, and the second resonator closest to the common terminal is a second resonator connected to the common terminal in the plurality of second resonators, no second resonators being connected in series between the common terminal and the second resonator connected to the common terminal.

* * * * *